United States Patent
Yang et al.

(10) Patent No.: US 9,564,244 B2
(45) Date of Patent: Feb. 7, 2017

(54) SHIFT REGISTER UNIT, SHIFT REGISTER, DISPLAY PANEL AND DISPLAY

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Ming Yang, Beijing (CN); Xi Chen, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 344 days.

(21) Appl. No.: 14/356,807

(22) PCT Filed: Jun. 20, 2013

(86) PCT No.: PCT/CN2013/077594
§ 371 (c)(1),
(2) Date: May 7, 2014

(87) PCT Pub. No.: WO2014/153872
PCT Pub. Date: Oct. 2, 2014

(65) Prior Publication Data
US 2016/0064097 A1    Mar. 3, 2016

(30) Foreign Application Priority Data
Mar. 29, 2013    (CN) .......................... 2013 1 0110049

(51) Int. Cl.
*G09G 3/36*    (2006.01)
*G11C 19/28*    (2006.01)
(Continued)

(52) U.S. Cl.
CPC .................. *G11C 19/28* (2013.01); *G09G 5/00* (2013.01); *G09G 3/20* (2013.01); *G09G 2300/04* (2013.01); *G09G 2310/0286* (2013.01)

(58) Field of Classification Search
CPC .................................. G09G 3/36; G11C 19/28
(Continued)

(56) References Cited

U.S. PATENT DOCUMENTS

2003/0231735 A1* 12/2003 Moon .................. G09G 3/3685
377/64
2011/0150169 A1* 6/2011 Lin ........................ G11C 19/28
377/64
(Continued)

FOREIGN PATENT DOCUMENTS

CN    1731501 A    2/2006
CN    102650751 A    8/2012
(Continued)

OTHER PUBLICATIONS

International Preliminary Report on Patentabiity Appl. No. PCT/CN2013/077594; Dated Sep. 29, 2015.
(Continued)

*Primary Examiner* — Amare Mengistu
*Assistant Examiner* — Joseph G Rodriguez
(74) *Attorney, Agent, or Firm* — Ladas & Parry LLP (57) ABSTRACT

A shift register unit, a shift register, a display panel and a display. The shift register unit comprises a holding module for holding a high level at a pulling up (PU) node when the PU node is at a high level. With the present invention, the level at the PU node may be pulled up rapidly in a charging stage, and a PD node may also be ensured to be at a higher potential in a noise eliminating stage, which may eliminate
(Continued)

noises at the PU node and a signal output terminal OUTPUT effectively, so that a picture quality may be enhanced.

19 Claims, 2 Drawing Sheets

(51) Int. Cl.
*G09G 5/00* (2006.01)
*G09G 3/20* (2006.01)

(58) Field of Classification Search
USPC .......................................................... 345/205
See application file for complete search history.

(56) References Cited

U.S. PATENT DOCUMENTS

2012/0163528 A1* 6/2012 Jang ..................... G09G 3/3688
377/64
2014/0085285 A1* 3/2014 Kim ..................... G09G 3/3266
345/211

FOREIGN PATENT DOCUMENTS

| CN | 102682699 A | 9/2012 |
| CN | 202502720 U | 10/2012 |
| TW | 201123728 A | 7/2011 |

OTHER PUBLICATIONS

First Chinese Office Action Appln. No. 201310110049.8; Dated Dec. 28, 2015.
International Search Report for International Application No. PCT/CN2013/077594, 13pgs.

* cited by examiner

SHIFT REGISTER UNIT, SHIFT REGISTER, DISPLAY PANEL AND DISPLAY

CROSS REFERENCE TO RELATED APPLICATIONS

This application is based on International Application No. PCT/CN2013/077594 filed on Jun. 20, 2013, which claims priority to Chinese National Application No. 201310110049.8 filed on Mar. 29, 2013. The entire contents of each and every foregoing application are incorporated herein by reference.

TECHNICAL FIELD

The present disclosure relates to a field of display driving technique, and particularly to a shift register unit, a shift register, a display panel and a display.

BACKGROUND

A Gate Drive on Array (GOA) technique is a technique for integrating a Gate Driver IC of a liquid crystal display on an Array Substrate. As compared with a traditional Chip On Flex (or Chip On Film, COF) technique and a traditional Chip On Glass (COG) technique, the GOA technique is advantageous in that: (1) integrating the Gate Driver IC on the array substrate reduces a manufacture cost effectively; (2) a bonding yield process is omitted, which may enhance the productivity and the yield of products; and (3) a bonding area for the Gate Driver IC is omitted, so that a display panel has a symmetrical structure and a narrow bezel may be realized on the display panel.

The GOA technique has many advantages, but it also has some problems, for example, an insufficient driving range (Vgh Margin) of a gate high level, a H-line Mura and abnormal display at high temperature, etc; a mainly reason for such problems is in that a voltage at a PU (Pull Up) node is not pulled up sufficiently in a charging stage, and a voltage at a PD (Pull Down) node is not high enough in a noise eliminating stage.

SUMMARY

In view of this, a main object of the present disclosure is to provide a shift register unit, a shift register, a display panel and a display, which are capable of pulling up a level at a PU node rapidly in a charging stage and ensuring a PD node being at a higher potential in a noise eliminating stage, which may eliminate noises at the PU node and a signal output terminal OUTPUT effectively, so that a picture quality may be enhanced.

In embodiments of the present disclosure, there is provided a shift register unit, comprising: a buffering module, a resetting module, a signal generation module, a first pulling-down module and a second pulling-down module, wherein the buffering module is connected with a signal input terminal; the resetting module is connected with a reset terminal, a power supply terminal and an output terminal of the buffering module, and is used for resetting the output terminal of the buffering module to a level of the power supply terminal under the control of a reset signal from the reset terminal; the first pulling-down module is connected with the reset terminal, the power supply terminal and a signal output terminal, and is used for pulling down the signal output terminal to the level of the power supply terminal under the control of the reset signal from the reset terminal; the signal generation module is connected with a clock terminal, the signal output terminal and the output terminal of the buffering module, and is used for outputting a clock signal from the clock terminal to the signal output terminal under the control of a signal output from the output terminal of the buffering module; the second pulling-down module is connected with a pulling-down node, the output terminal of the buffering module, the power supply terminal and the signal output terminal, and is used for pulling down the signal output terminal and the output terminal of the buffering module to the level of the power supply terminal under the control of a signal from the pulling-down node; characterized in that the shift register unit further comprises a holding module connected with the output terminal of the buffering module, the pulling-down node and the power supply terminal, and used for pulling down the pulling-down node to the level of the power supply terminal when the output terminal of the buffering module is at a high level.

In an example, the buffering module comprises a first thin film transistor, a gate and a drain of the first thin film transistor are connected with the signal input terminal; the resetting module comprises a second thin film transistor, a gate of the second thin film transistor is connected with the reset terminal, a source of the second thin film transistor is connected with the power supply terminal, and a drain of the second thin film transistor is connected with a source of the first thin film transistor; the signal generation module comprises a third thin film transistor and a capacitor connected with the third thin film transistor, one terminal of the capacitor is connected with a gate of the third thin film transistor, the other terminal of the capacitor is connected with a source of the third thin film transistor and the signal output terminal; the first pulling-down module comprises a fourth thin film transistor, a gate of the fourth thin film transistor is connected with the reset terminal, a source of the fourth thin film transistor is connected with the power supply terminal, and a drain of the fourth thin film transistor is connected with the source of the third thin film transistor; the second pulling-down module comprises a tenth thin film transistor and an eleventh thin film transistor, gates of the tenth and eleventh thin film transistors are connected with the pulling-down node, sources of the tenth and eleventh thin film transistors are connected with the power supply terminal, a drain of the tenth thin film transistor is connected with the drain of the fourth thin film transistor, and a drain of the eleventh thin film transistor is connected with the drain of the second thin film transistor.

In an example, the gate of the first thin film transistor is connected with the signal input terminal, the source of the first thin film transistor is connected with the drain of the second thin film transistor and the gate of the third thin film transistor, the drain of the first thin film transistor is connected with the signal input terminal; the gate of the second thin film transistor is connected with the reset terminal and the gate of the fourth thin film transistor, the source of the second thin film transistor is connected with the source of the fourth thin film transistor and the power supply terminal, and the drain of the second thin film transistor is connected with the gate of the third thin film transistor; the source of the third thin film transistor is connected with the drain of the fourth thin film transistor and the signal output terminal, the drain of the third thin film transistor is connected with the clock terminal; the gate of the fourth thin film transistor is connected with the reset terminal, and the drain of the fourth thin film transistor is connected with the signal output terminal.

In an example, the holding module comprises a sixth thin film transistor, a gate of the sixth thin film transistor is connected with the source of the first thin film transistor, a source of the sixth thin film transistor is connected with the power supply terminal, and a drain of the sixth thin film transistor is connected with the pulling-down node.

In an example, the holding module comprises a fifth thin film transistor and a sixth thin film transistor.

In an example, a gate of the fifth thin film transistor is connected with the source of the first thin film transistor, the drain of the second thin film transistor and the gate of the third thin film transistor; a source of the fifth thin film transistor is connected with the source of the second thin film transistor, the source of the fourth thin film transistor and the power supply terminal; a drain of the fifth thin film transistor is connected with the clock terminal; a gate of the sixth thin film transistor is connected with the gate of the fifth thin film transistor, a source of the sixth thin film transistor is connected with the source of the fifth thin film transistor, the source of the second thin film transistor, the source of the fourth thin film transistor and the power supply terminal, and a drain of the sixth thin film transistor is connected with the clock terminal.

In an example, the shift register unit further comprises a seventh thin film transistor, a gate of the seventh thin film transistor is connected with the gate of the first thin film transistor and the signal input terminal; a source of the seventh thin film transistor is connected with the source of the second thin film transistor, the source of the fifth thin film transistor, the source of the sixth thin film transistor, the source of the fourth thin film transistor and the power supply terminal; and a drain of the seventh thin film transistor is connected with the drain of the sixth thin film transistor.

In an example, the sixth thin film transistor is a thin film transistor with a dual-gate structure.

In an example, the holding module further comprises an eighth thin film transistor and a ninth thin film transistor; wherein the case that the drain of the fifth thin film transistor is connected with the clock terminal comprises: the drain of the fifth thin film transistor is connected with a source of the eighth thin film transistor and a gate of the ninth thin film transistor, a gate and a drain of the eighth thin film transistor are connected with the clock terminal, and a drain of the ninth thin film transistor is connected with the clock terminal;

the case that the drain of the sixth thin film transistor is connected with the clock terminal comprises: the drain of the sixth thin film transistor is connected with a source of the ninth thin film transistor, and the drain of the ninth thin film transistor is connected with the gate of the eighth thin film transistor and the clock terminal.

In an example, the shift register unit further comprises a twelfth thin film transistor, wherein the gate of the fifth thin film transistor is connected with the source of the first thin film transistor, the drain of the second thin film transistor, the drain of the eleventh thin film transistor and the gate of the third thin film transistor, through the twelfth thin film transistor.

The gate of the fifth thin film transistor is connected with a source of the twelfth thin film transistor, a gate of the twelfth thin film transistor is connected with the source of the first thin film transistor, the drain of the second thin film transistor, the drain of the eleventh thin film transistor and the gate of the third thin film transistor; a drain of the twelfth thin film transistor is connected with the gate and drain of the eighth thin film transistor and the drain of the ninth thin film transistor.

In the embodiments of the present disclosure, there is further provided a shift register comprising at least one shift register unit, which is any of the shift register units described above; wherein, when a plurality of shift register units are adopted, the plurality of shift register units are connected in cascade.

In the embodiments of the present disclosure, there is still provided a display panel, wherein the display panel comprises the shift register described above which serves as a gate driver of the display panel.

In the embodiments of the present disclosure, there is still provided a display, wherein the display comprises the display panel described above.

The shift register unit, the shift register, the display panel and the display provided in the embodiments of the present disclosure have advantages and characteristics as follows.

According to the embodiments of the present disclosure, the gate of the fifth thin film transistor is connected with the PU node, and the gate of the sixth thin film transistor is connected with the PU node through the gate of the fifth thin film transistor; alternatively, the gate of the fifth thin film transistor is connected with the PU node through the twelfth thin film transistor, and the gate of the sixth thin film transistor is connected with the PU node through the gate of the fifth thin film transistor and the twelfth thin film transistor; thus, when the PU node is at a high level, the shift register unit with such circuit structure may eliminate the noises at the PU node and the OUTPUT effectively.

Further, in the circuit of the shift register unit according to the embodiments of the present disclosure, the voltage at the PD node may be pulled down rapidly due to a disposition of the seventh thin film transistor, therefore it is benefit for charging the PU node and holding the voltage at the PU node.

The sixth thin film transistor according to the embodiments of the present disclosure is the thin film transistor with the dual-gate structure, which may reduce a current between the source and the drain effectively, so that the PD node is ensured to be at a higher potential, and in turn the noises at the PU node and the OUTPUT may be eliminated effectively.

DETAILED DESCRIPTION

Implementations of the present disclosure will be described in detail below in connection with detailed embodiments and drawings.

A shift register unit according to the embodiments of the present disclosure comprises: a buffering module, a resetting module, a signal generation module, a first pulling-down module and a second pulling-down module, the buffering module is connected with a signal input terminal; the resetting module is connected with a reset terminal, a power supply terminal and an output terminal of the buffering module, and is used for resetting the output terminal of the buffering module to a level of the power supply terminal under the control of a reset signal from the reset terminal; the first pulling-down module is connected with the reset terminal, the power supply terminal and a signal output terminal, and is used for pulling down the signal output terminal to the level of the power supply terminal under the control of the reset signal from the reset terminal; the signal generation module is connected with a clock terminal, the signal output terminal and the output terminal of the buffering module, and is used for outputting a clock signal from the clock terminal to the signal output terminal under the control of a signal output from the output terminal of the buffering module; the second pulling-down module is connected with a pulling-down node, the output terminal of the buffering module, the power supply terminal and the signal output terminal, and is used for pulling down the signal output terminal and the output terminal of the buffering module to the level of the power supply terminal under the control of a signal from the pulling-down node; wherein the shift register unit further comprises a holding module connected with the output terminal of the buffering module, the pulling-down node and the power supply terminal, and used for pulling down the pulling-down node to the level of the power supply terminal when the output terminal of the buffering module is at a high level.

In an example, the buffering module may comprise a first thin film transistor, a gate and a drain of the first thin film transistor are connected with the signal input terminal; the resetting module comprises a second thin film transistor, a gate of the second thin film transistor is connected with the reset terminal, a source of the second thin film transistor is connected with the power supply terminal, and a drain of the second thin film transistor is connected with a source of the first thin film transistor; the signal generation module comprises a third thin film transistor and a capacitor connected with the third thin film transistor, one terminal of the capacitor is connected with a gate of the third thin film transistor, the other terminal of the capacitor is connected with a source of the third thin film transistor and the signal output terminal; the first pulling-down module comprises a fourth thin film transistor, a gate of the fourth thin film transistor is connected with the reset terminal, a source of the fourth thin film transistor is connected with the power supply terminal, and a drain of the fourth thin film transistor is connected with the source of the third thin film transistor; the second pulling-down module comprises a tenth thin film transistor and an eleventh thin film transistor, gates of the tenth and eleventh thin film transistors are connected with the pulling-down node, sources of the tenth and eleventh thin film transistors are connected with the power supply terminal, a drain of the tenth thin film transistor is connected with the drain of the fourth thin film transistor, and a drain of the eleventh thin film transistor is connected with the drain of the second thin film transistor.

In an example, the gate of the first thin film transistor is connected with the signal input terminal, the source of the first thin film transistor is connected with the drain of the second thin film transistor and the gate of the third thin film transistor, the drain of the first thin film transistor is connected with the signal input terminal.

The gate of the second thin film transistor is connected with the reset terminal and the gate of the fourth thin film transistor, the source of the second thin film transistor is connected with the source of the fourth thin film transistor and the power supply terminal, and the drain of the second thin film transistor is connected with the gate of the third thin film transistor.

The source of the third thin film transistor is connected with the drain of the fourth thin film transistor and the signal output terminal, the drain of the third thin film transistor is connected with the clock terminal.

The gate of the fourth thin film transistor is connected with the reset terminal, and the drain of the fourth thin film transistor is connected with the signal output terminal.

In an example, the holding module comprises a sixth thin film transistor, a gate of the sixth thin film transistor is connected with the source of the first thin film transistor, a source of the sixth thin film transistor is connected with the power supply terminal, and a drain of the sixth thin film transistor is connected with the pulling-down node.

In another example, the holding module may comprises a fifth thin film transistor and a sixth thin film transistor.

A gate of the fifth thin film transistor is connected with the source of the first thin film transistor, the drain of the second thin film transistor and the gate of the third thin film transistor; a source of the fifth thin film transistor is connected with the source of the second thin film transistor, the source of the fourth thin film transistor and the power supply terminal; a drain of the fifth thin film transistor is connected with the clock terminal; a gate of the sixth thin film transistor is connected with the gate of the fifth thin film transistor, a source of the sixth thin film transistor is connected with the source of the fifth thin film transistor, the source of the second thin film transistor, the source of the fourth thin film transistor and the power supply terminal, and a drain of the sixth thin film transistor is connected with the clock terminal.

In an example, the shift register unit further comprises a seventh thin film transistor, a gate of the seventh thin film transistor is connected with the gate of the first thin film transistor and the signal input terminal; a source of the seventh thin film transistor is connected with the source of the second thin film transistor, the source of the fifth thin film transistor, the source of the sixth thin film transistor, the source of the fourth thin film transistor and the power supply terminal; and a drain of the seventh thin film transistor is connected with the drain of the sixth thin film transistor.

In an example, the sixth thin film transistor may be a thin film transistor with a dual-gate structure.

In an example, the holding module may further comprise an eighth thin film transistor and a ninth thin film transistor; wherein In this situation, the case that the drain of the fifth thin film transistor is connected with the clock terminal comprises: the drain of the fifth thin film transistor is connected with a source of the eighth thin film transistor and a gate of the ninth thin film transistor, a gate and a drain of the eighth thin film transistor are connected with the clock terminal, and a drain of the ninth thin film transistor is connected with the clock terminal; the case that the drain of the sixth thin film transistor is connected with the clock terminal comprises: the drain of the sixth thin film transistor is connected with a source of the ninth thin film transistor, and the drain of the ninth thin film transistor is connected with the clock terminal.

In an example, the shift register unit may further comprise a twelfth thin film transistor, the gate of the fifth thin film transistor is connected with the source of the first thin film transistor, the drain of the second thin film transistor, the drain of the eleventh thin film transistor and the gate of the third thin film transistor through the twelfth thin film transistor.

In this situation, the gate of the fifth thin film transistor is connected with a source of the twelfth thin film transistor, a gate of the twelfth thin film transistor is connected with the source of the first thin film transistor, the drain of the second thin film transistor, the drain of the eleventh thin film transistor and the gate of the third thin film transistor; a drain of the twelfth thin film transistor is connected with the drain of the eighth thin film transistor, the drain of the ninth thin film transistor, and the drain of the ninth thin film transistor.

First Embodiment

Figure 1:
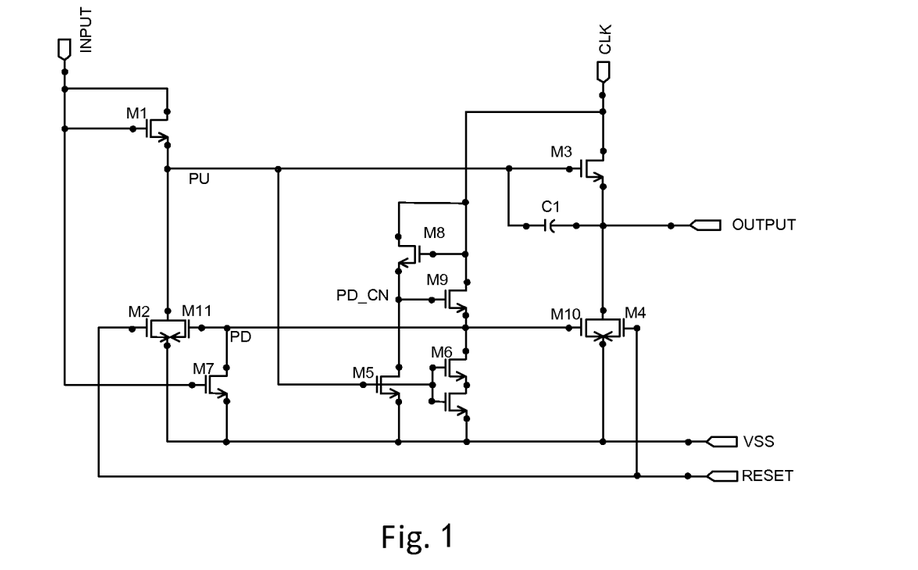
FIG. 1 is a first circuit diagram illustrating a shift register unit according to a first embodiment of the present disclosure.

FIG. 1 is a circuit diagram illustrating a shift register unit according to the first embodiment. As illustrated in FIG. 1, the shift register unit comprises: a first thin film transistor M1 to an eleventh thin film transistor M11; a signal input terminal INPUT, a signal output terminal OUTPUT, a clock terminal CLK, a reset terminal RESET, a power supply terminal VSS and one capacitor C1; where a gate of the first thin film transistor M1 is connected with the signal input terminal INPUT and a gate of the seventh thin film transistor M7, a source of the first thin film transistor M1 is connected with a gate of the third thin film transistor M3, a gate of the fifth thin film transistor M5, a gate of the sixth thin film transistor M6, a drain of the second thin film transistor M2 and a drain of the eleventh thin film transistor M11, and a drain of the first thin film transistor M1 is connected with the signal input terminal INPUT;

a gate of the second thin film transistor M2 is connected with a gate of the fourth thin film transistor M4, and a source of the second thin film transistor M2 is connected with a source of the eleventh thin film transistor M11, a source of the seventh thin film transistor M7, a source of the fifth thin film transistor M5, a source of the sixth thin film transistor M6, a source of the fourth thin film transistor M4 and a source of the tenth thin film transistor M10;

a source of the third thin film transistor M3 is connected with a drain of the fourth thin film transistor M4 and a drain of the tenth thin film transistor M10, and a drain of the third thin film transistor M3 is connected with a gate and a drain of the eighth thin film transistor M8 and a drain of the ninth thin film transistor M9;

a drain of the fifth thin film transistor M5 is connected with a gate of the ninth thin film transistor M9 and a source of the eighth thin film transistor M8;

a drain of the sixth thin film transistor M6 is connected with a gate of the tenth thin film transistor M10, a source of the ninth thin film transistor M9, a drain of the seventh thin film transistor M7 and a gate of the eleventh thin film transistor M11;

one terminal of the capacitor C1 is connected with a gate of the third thin film transistor M3, and the other terminal of the capacitor C1 is connected with the source of the third thin film transistor M3 and the signal output terminal OUTPUT;

the source of the third thin film transistor M3, the drain of the fourth thin film transistor M4 and the drain of the tenth thin film transistor M10 are connected with the signal output terminal OUTPUT;

the drain of the third thin film transistor M3, the gate and the drain of the eighth thin film transistor M8 and the drain of the ninth thin film transistor M9 are connected with the clock terminal CLK;

the source of the second thin film transistor M2, the source of the eleventh thin film transistor M11, the source of the seventh thin film transistor M7, the source of the fifth thin film transistor M5, the source of the sixth thin film transistor M6, the source of the fourth thin film transistor M4 and the source of the tenth thin film transistor M10 are connected with the power supply terminal VSS; and the gate of the second thin film transistor M2 and the gate of the fourth thin film transistor M4 are connected with the reset terminal RESET.

Herein, a structure utilized in the sixth thin film transistor may be a dual-gate structure as illustrated by the M6 in FIG. 1, or may be a single-gate structure as illustrated by the M6 in FIG. 6. When the sixth thin film transistor is a transistor with the dual-gate structure, a PD node may be ensured to be in a higher potential because the transistor with the dual-gate structure may reduce a current between the source and the drain effectively, and in turn noises at the PU node and the signal output terminal OUTPUT may be eliminated effectively.

Figure 2:
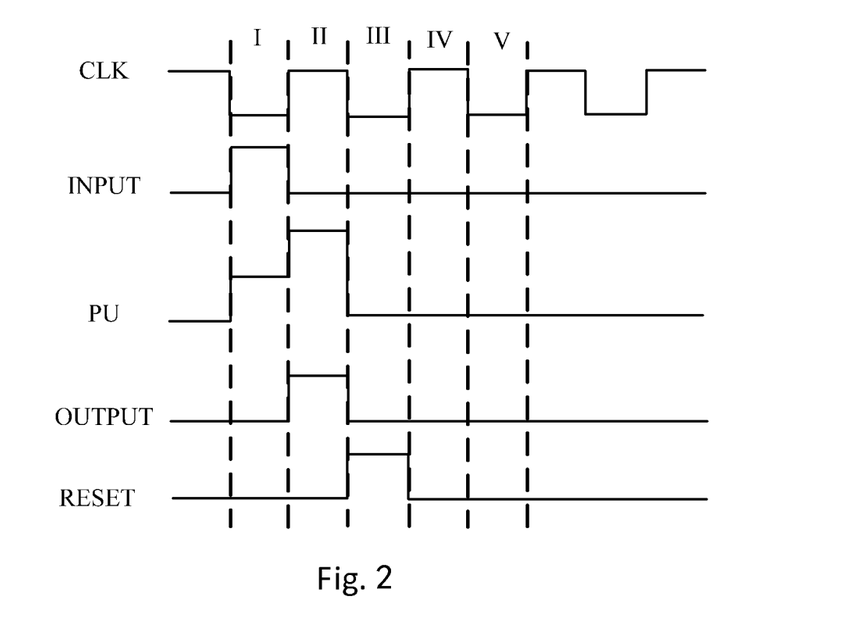
FIG. 2 is an operation timing chart of the first embodiment.
Figure 3:
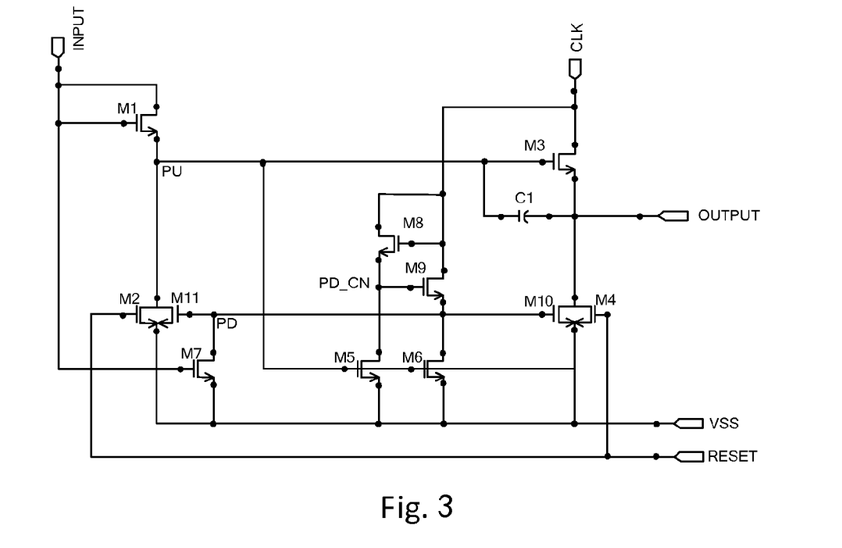
FIG. 3 is a second circuit diagram illustrating the shift register unit according to the first embodiment.

FIG. 2 is an operation timing chart of the first embodiment. According to the operation timing chart shown in FIG. 2, the operation principle of the shift register unit according to the first embodiment may be divided into five stages which will be described later.

In a first stage: the INPUT is at a high level, the M1 is turned on, then the PU node is at a high level and the PU node is charged; the RESET is at a low level, the M2 and M4 are turned off, and the PU node is ensured to be charged completely because the M2 and M4 are turned off; the INPUT is at a high level, the M7 is turned on, and the PD node is pulled down to the low level rapidly because the source of the M7 is connected with the VSS, thus the M10 and M11 are turned off; the PU node is at a high level, the M5 is turned on, and a PD_CN node is at a low level because the source of the M5 is connected with the VSS; the PD node and the PD_CN node are at a low level at the same time, therefore it is benefit for holding a voltage at the PU node; at this time, the M3 is turned on since the PU node is at a high level, and the OUTPUT outputs the low level because the CLK is at a low level.

During this stage, the voltage at the PD node is pulled down rapidly by the seventh thin film transistor M7, therefore it is benefit for charging the PU node and holding the voltage at the PU node.

In a second stage: the INPUT changes to a low level, the M1 is turned off, the RESET is still at a low level, so the M2 and M4 are still turned off, the PU node is still at a high level because of a charge holding effect of the C1, and the M3 is turned on; because the M3 is turned on and the CLK is at a high level, the OUTPUT outputs a high level, thus the voltage at the PU node is further pulled up due to a bootstrapping effect of the C1; the M6 and M5 are turned on because the PU node is held to be in a high level state; further, the PD node and the PD_CN node are held to be in a low level state continually because the source of the M6 and the source of the M5 are connected with the VSS, so that the M10 and M11 are held to be turned off continually.

During this stage, because the gate of the M5 is connected with the PU node and the gate of the M6 is connected with the PU node via the gate of the M5, the PU node is at a high level in this stage, and also because the voltage at the PU node is higher than the voltage at the OUTPUT because of the bootstrapping effect of the C1, the noises at the PU node and the signal output terminal OUTPUT may be eliminated effectively.

In a third stage: the INPUT is still at a low level, the RESET changes to a high level, then the M2 and M4 are turned on, and the PU node is pulled down to a low level at this time because the source of the M2 is connected with the VSS; the M4 is turned on, the OUTPUT outputs the low level because the source of the M4 is connected with the VSS; the M6 and M5 are turned off since the PU node is at a low level, and the M8 and M9 are turned off because the CLK is at a low level, therefore the PD node and the PD_CN node are held to be in the low level state continually, thus the M10 and M11 are held to be turned off continually.

In a fourth stage: the INPUT is still at a low level, the PU node is at a low level, the M3 is turned off, the OUTPUT continues to output a low level; the M6 and M5 are still kept to be in a turn-off state because the PU node is at a low level; the M8 is turned on since the CLK is at a high level, the PD_CN node is at a high level, the M9 is turned on, and the PD node is at a high level; the M11 and M10 are turned on because the PD node is at a high level, and because the sources of the M10 and M11 are connected with the VSS, the M11 may eliminate the noise at the PU node while the M10 may eliminate the noise at the OUTPUT.

During this stage, the gate and source of the M6 are at a low level at the same time. When the M6 is the thin film transistor with the dual-gate structure, the PD node may be ensured to be at a higher potential because the dual-gate structure may reduce the current between the source and the drain effectively, and in turn the noises at the PU node and the OUTPUT may be eliminated effectively.

In a fifth stage: the INPUT is still at a low level, the RESET is still at a low level, and the PU node is still at a low level, the M3 is turned off, and the OUTPUT continues to output a low level; the M6 and M5 are turned off because the PU node is at a low level, the M9 is turned on because the PD_CN node is held to be at a high level; the PD node changes to a low level because the M9 is turned on and the CLK is at a low level.

According to the first embodiment of the present disclosure, a duty cycle of the PD node is lower than 50% slightly, which is benefit for prolonging usage lifespan of the M11 and M10; herein for a certain continuous operation period, the duty cycle is a ratio value of a time in which the PD node is at a high level to a total time of the continuous operation period.

Thereafter, the shift register unit repeats states of the fourth stage and the fifth stage, until states of the first stage, the second stage and the third stage shown in FIG. 2 occur, so that one frame of picture is refreshed completely.

Second Embodiment

Figure 4:
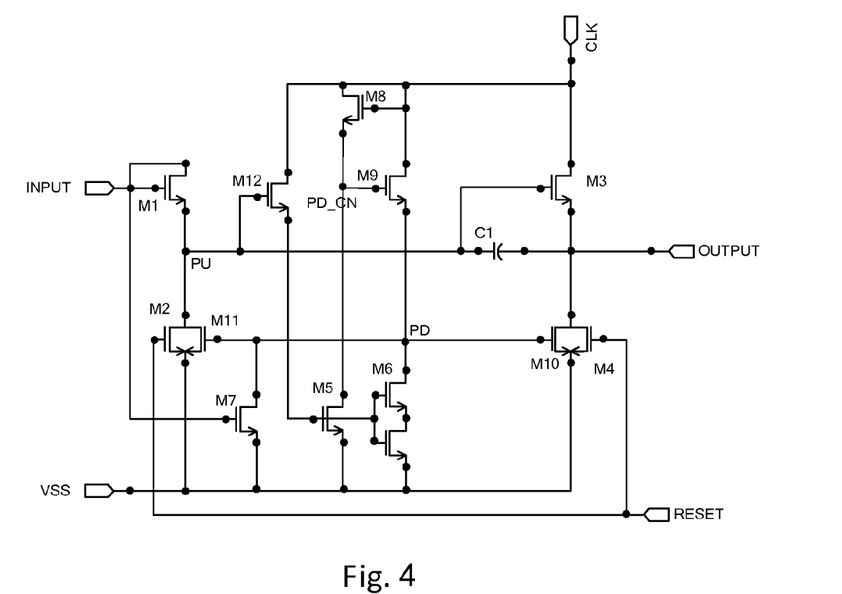
FIG. 4 is a circuit diagram illustrating a shift register unit according to a second embodiment.

FIG. 4 is a circuit diagram illustrating a shift register unit according to the second embodiment. As illustrated in FIG. 4, the shift register unit comprises: a first thin film transistor M1 to a twelfth thin film transistor M12; a signal input terminal INPUT, a signal output terminal OUTPUT, a clock terminal CLK, a reset terminal RESET, a power supply terminal VSS and one capacitor C1; where a gate of the first thin film transistor M1 is connected with the signal input terminal INPUT and a gate of the seventh thin film transistor M7, a source of the first thin film transistor M1 is connected with a drain of the second thin film transistor M2, a drain of the eleventh thin film transistor M11, a gate of the twelfth thin film transistor M12 and a gate of the third thin film transistor M3, and a drain of the first thin film transistor M1 is connected with the signal input terminal INPUT;

a gate of the second thin film transistor M2 is connected with a gate of the fourth thin film transistor M4, and a source of the second thin film transistor M2 is connected with a source of the eleventh thin film transistor M11, a source of the seventh thin film transistor M7, a source of the fifth thin film transistor M5, a source of the sixth thin film transistor M6, a source of the fourth thin film transistor M4 and a source of the tenth thin film transistor M10;

a source of the third thin film transistor M3 is connected with a drain of the fourth thin film transistor M4 and a drain of the tenth thin film transistor M10, and a drain of the third thin film transistor M3 is connected with a gate and a drain of the eighth thin film transistor M8, a drain of the ninth thin film transistor M9 and a drain of the twelfth thin film transistor M12;

a gate of the fifth thin film transistor M5 is connected with a source of the twelfth thin film transistor M12 and a gate of the sixth thin film transistor M6, and a drain of the fifth thin film transistor M5 is connected with a gate of the ninth thin film transistor M9 and a source of the eighth thin film transistor M8;

a drain of the sixth thin film transistor M6 is connected with a gate of the tenth thin film transistor M10, a source of the ninth thin film transistor M9, a drain of the seventh thin film transistor M7 and a gate of the eleventh thin film transistor M11;

one terminal of the capacitor C1 is connected with a gate of the third thin film transistor M3, and the other terminal of the capacitor C1 is connected with the source of the third thin film transistor M3 and the signal output terminal OUTPUT;

the source of the third thin film transistor M3, the drain of the fourth thin film transistor M4 and the drain of the tenth thin film transistor M10 are connected with the signal output terminal OUTPUT;

the drain of the third thin film transistor M3, the gate and the drain of the eighth thin film transistor M8, the drain of the ninth thin film transistor M9 and the drain of the twelfth thin film transistor M12 are connected with the clock terminal CLK;

the source of the second thin film transistor M2, the source of the eleventh thin film transistor M11, the source of the seventh thin film transistor M7, the source of the fifth thin film transistor M5, the source of the sixth thin film transistor M6, the source of the fourth thin film transistor M4 and the source of the tenth thin film transistor M10 are connected with the power supply terminal VSS; and the gate of the second thin film transistor M2 and the gate of the fourth thin film transistor M4 are connected with the reset terminal RESET.

Herein, the sixth thin film transistor may be a dual-gate structure as illustrated by the M6 in FIG. 4, or may be a single-gate structure.

It should be noted that, the VSS is a power supply terminal, and the power supply terminal VSS is always in the low level state; also, in the embodiments of the present disclosure, a switching electrode of the thin film transistor is defined as the gate, an electrode in a direction indicated by an arrow is defined as the source, and the other electrode is defined as the drain. Furthermore, all of the thin film transistors in the embodiments of the present disclosure are N-type thin film transistors.

In the embodiments of the present disclosure, the gate of the fifth thin film transistor M5 is connected with the PU node, and the gate of the sixth thin film transistor M6 is connected with the PU node through the gate of the fifth thin film transistor M5 (as illustrated in the shift register unit according to the first embodiment); alternatively, the gate of the fifth thin film transistor M5 is connected with the PU node through the twelfth thin film transistor M12, and the gate of the sixth thin film transistor M6 is connected with the PU node through the gate of the fifth thin film transistor M5 and the twelfth thin film transistor M12 (as illustrated in the shift register unit according to the second embodiment); thus, when the PU node is at a high level, the shift register unit with such circuit structure may eliminate the noises at the PU node and the OUTPUT effectively.

According to the embodiments of the present disclosure, there is further provided a shift register comprising at least one shift register unit, which is any of the shift register units described above; wherein, when a plurality of shift register units are adopted, the plurality of shift register units are connected in cascade.

According to the embodiments of the present disclosure, there is further provided a display panel, wherein the display panel comprises the shift register described above which serves as a gate driver of the display panel.

According to the embodiments of the present disclosure, there is further provided a display, wherein the display comprises the display panel described above.

Above are only preferred embodiments of the present disclosure and is not intended to limit a scope sought for protection by the present disclosure.

What is claimed is:

1. A shift register unit, comprising: a buffering module, a resetting module, a signal generation module, a first pulling-down module and a second pulling-down module, wherein the buffering module is connected with a signal input terminal; the resetting module is connected with a reset terminal, a power supply terminal and an output terminal of the buffering module, and is used for resetting the output terminal of the buffering module to a level of the power supply terminal under the control of a reset signal from the reset terminal; the first pulling-down module is connected with the reset terminal, the power supply terminal and a signal output terminal, and is used for pulling down the signal output terminal to the level of the power supply terminal under the control of the reset signal from the reset terminal; the signal generation module is connected with a clock terminal, the signal output terminal and the output terminal of the buffering module, and is used for outputting a clock signal from the clock terminal to the signal output terminal under the control of a signal output from the output terminal of the buffering module; the second pulling-down module is connected with a pulling-down node, the output terminal of the buffering module, the power supply terminal and the signal output terminal, and is used for pulling down the signal output terminal and the output terminal of the buffering module to the level of the power supply terminal under the control of a signal from the pulling-down node; characterized in that the shift register unit further comprises a holding module connected with the output terminal of the buffering module, the pulling-down node and the power supply terminal, and used for pulling down the pulling-down node to the level of the power supply terminal when the output terminal of the buffering module is at a high level, characterized in that the buffering module comprises a first thin film transistor, a gate and a drain of the first thin film transistor are connected with the signal input terminal;

the resetting module comprises a second thin film transistor, a gate of the second thin film transistor is connected with the reset terminal, a source of the second thin film transistor is connected with the power supply terminal, and a drain of the second thin film transistor is connected with a source of the first thin film transistor;

the signal generation module comprises a third thin film transistor and a capacitor connected with the third thin film transistor, one terminal of the capacitor is connected with a gate of the third thin film transistor, the other terminal of the capacitor is connected with a source of the third thin film transistor and the signal output terminal;

the first pulling-down module comprises a fourth thin film transistor, a gate of the fourth thin film transistor is connected with the reset terminal, a source of the fourth thin film transistor is connected with the power supply terminal, and a drain of the fourth thin film transistor is connected with the source of the third thin film transistor; and the second pulling-down module comprises a tenth thin film transistor and an eleventh thin film transistor, gates of the tenth and eleventh thin film transistors are connected with the pulling-down node, sources of the tenth and eleventh thin film transistors are connected with the power supply terminal, a drain of the tenth thin film transistor is connected with the drain of the fourth thin film transistor, and a drain of the eleventh thin film transistor is connected with the drain of the second thin film transistor.

2. The shift register unit of claim 1, characterized in that the holding module comprises a sixth thin film transistor, a gate of the sixth thin film transistor is connected with the source of the first thin film transistor, a source of the sixth thin film transistor is connected with the power supply terminal, and a drain of the sixth thin film transistor is connected with the pulling-down node.

3. The shift register unit of claim 1, characterized in that the holding module comprises a fifth thin film transistor and a sixth thin film transistor; a gate of the fifth thin film transistor is connected with the source of the first thin film transistor, the drain of the second thin film transistor and the gate of the third thin film transistor; a source of the fifth thin film transistor is connected with the source of the second thin film transistor, the source of the fourth thin film transistor and the power supply terminal, a drain of the fifth thin film transistor is connected with the drain of the third thin film transistor and the clock terminal; a gate of the sixth thin film transistor is connected with the gate of the fifth thin film transistor, a source of the sixth thin film transistor is connected with the power supply terminal, and a drain of the sixth thin film transistor is connected with the clock terminal.

4. The shift register unit of claim 3, characterized in that the shift register unit further comprises a seventh thin film transistor, a gate of the seventh thin film transistor is connected with the gate of the first thin film transistor and the signal input terminal; a source of the seventh thin film transistor is connected with the source of the second thin film transistor, the source of the fifth thin film transistor, the source of the sixth thin film transistor, the source of the fourth thin film transistor and the power supply terminal; and a drain of the seventh thin film transistor is connected with the drain of the sixth thin film transistor.

5. The shift register unit of claim 3, characterized in that the sixth thin film transistor is a thin film transistor with a dual-gate structure.

6. The shift register unit of claim 3, characterized in that the holding module further comprises an eighth thin film transistor and a ninth thin film transistor; wherein the case that the drain of the fifth thin film transistor is connected with the clock terminal comprises: the drain of the fifth thin film transistor is connected with a source of the eighth thin film transistor and a gate of the ninth thin film transistor, a gate and a drain of the eighth thin film transistor are connected with the clock terminal, and a drain of the ninth thin film transistor is connected with the clock terminal;

the case that the drain of the sixth thin film transistor is connected with the clock terminal comprises: the drain of the sixth thin film transistor is connected with a source of the ninth thin film transistor, and the drain of the ninth thin film transistor is connected with the clock terminal.

7. The shift register unit of claim 3, characterized in that the shift register unit further comprises a twelfth thin film transistor, the gate of the fifth thin film transistor is connected with a source of the twelfth thin film transistor, a gate of the twelfth thin film transistor is connected with the source of the first thin film transistor, the drain of the second thin film transistor, the drain of the eleventh thin film transistor and the gate of the third thin film transistor; and a drain of the twelfth thin film transistor is connected with the drain of the eighth thin film transistor, the drain of the ninth thin film transistor and the clock terminal.

8. A shift register characterized by comprising at least one shift register unit, which is the shift register unit of claim 1,
wherein when a plurality of shift register units are adopted, the plurality of shift register units are connected in cascade.

9. A display panel characterized by comprising the shift register of claim 8, which serves as a gate driver of the display panel.

10. The display panel of claim 9, characterized in that
the buffering module comprises a first thin film transistor, a gate and a drain of the first thin film transistor are connected with the signal input terminal;
the resetting module comprises a second thin film transistor, a gate of the second thin film transistor is connected with the reset terminal, a source of the second thin film transistor is connected with the power supply terminal, and a drain of the second thin film transistor is connected with a source of the first thin film transistor;
the signal generation module comprises a third thin film transistor and a capacitor connected with the third thin film transistor, one terminal of the capacitor is connected with a gate of the third thin film transistor, the other terminal of the capacitor is connected with a source of the third thin film transistor and the signal output terminal;
the first pulling-down module comprises a fourth thin film transistor, a gate of the fourth thin film transistor is connected with the reset terminal, a source of the fourth thin film transistor is connected with the power supply terminal, and a drain of the fourth thin film transistor is connected with the source of the third thin film transistor; and
the second pulling-down module comprises a tenth thin film transistor and an eleventh thin film transistor, gates of the tenth and eleventh thin film transistors are connected with the pulling-down node, sources of the tenth and eleventh thin film transistors are connected with the power supply terminal, a drain of the tenth thin film transistor is connected with the drain of the fourth thin film transistor, and a drain of the eleventh thin film transistor is connected with the drain of the second thin film transistor.

11. The display panel of claim 10, characterized in that the holding module comprises a sixth thin film transistor, a gate of the sixth thin film transistor is connected with the source of the first thin film transistor, a source of the sixth thin film transistor is connected with the power supply terminal, and a drain of the sixth thin film transistor is connected with the pulling-down node.

12. The display panel of claim 10, characterized in that the holding module comprises a fifth thin film transistor and a sixth thin film transistor; a gate of the fifth thin film transistor is connected with the source of the first thin film transistor, the drain of the second thin film transistor and the gate of the third thin film transistor; a source of the fifth thin film transistor is connected with the source of the second thin film transistor, the source of the fourth thin film transistor and the power supply terminal, a drain of the fifth thin film transistor is connected with the drain of the third thin film transistor and the clock terminal; a gate of the sixth thin film transistor is connected with the gate of the fifth thin film transistor, a source of the sixth thin film transistor is connected with the power supply terminal, and a drain of the sixth thin film transistor is connected with the clock terminal.

13. The display panel of claim 12, characterized in that the shift register unit further comprises a seventh thin film transistor, a gate of the seventh thin film transistor is connected with the gate of the first thin film transistor and the signal input terminal; a source of the seventh thin film transistor is connected with the source of the second thin film transistor, the source of the fifth thin film transistor, the source of the sixth thin film transistor, the source of the fourth thin film transistor and the power supply terminal; and a drain of the seventh thin film transistor is connected with the drain of the sixth thin film transistor.

14. The display panel of claim 12, characterized in that the holding module further comprises an eighth thin film transistor and a ninth thin film transistor; wherein
the case that the drain of the fifth thin film transistor is connected with the clock terminal comprises: the drain of the fifth thin film transistor is connected with a source of the eighth thin film transistor and a gate of the ninth thin film transistor, a gate and a drain of the eighth thin film transistor are connected with the clock terminal, and a drain of the ninth thin film transistor is connected with the clock terminal;
the case that the drain of the sixth thin film transistor is connected with the clock terminal comprises: the drain of the sixth thin film transistor is connected with a source of the ninth thin film transistor, and the drain of the ninth thin film transistor is connected with the clock terminal.

15. The shift register of claim 8, characterized in that
the buffering module comprises a first thin film transistor, a gate and a drain of the first thin film transistor are connected with the signal input terminal;
the resetting module comprises a second thin film transistor, a gate of the second thin film transistor is connected with the reset terminal, a source of the second thin film transistor is connected with the power supply terminal, and a drain of the second thin film transistor is connected with a source of the first thin film transistor;
the signal generation module comprises a third thin film transistor and a capacitor connected with the third thin film transistor, one terminal of the capacitor is connected with a gate of the third thin film transistor, the other terminal of the capacitor is connected with a source of the third thin film transistor and the signal output terminal;

the first pulling-down module comprises a fourth thin film transistor, a gate of the fourth thin film transistor is connected with the reset terminal, a source of the fourth thin film transistor is connected with the power supply terminal, and a drain of the fourth thin film transistor is connected with the source of the third thin film transistor; and the second pulling-down module comprises a tenth thin film transistor and an eleventh thin film transistor, gates of the tenth and eleventh thin film transistors are connected with the pulling-down node, sources of the tenth and eleventh thin film transistors are connected with the power supply terminal, a drain of the tenth thin film transistor is connected with the drain of the fourth thin film transistor, and a drain of the eleventh thin film transistor is connected with the drain of the second thin film transistor.

16. The shift register of claim 15, characterized in that the holding module comprises a sixth thin film transistor, a gate of the sixth thin film transistor is connected with the source of the first thin film transistor, a source of the sixth thin film transistor is connected with the power supply terminal, and a drain of the sixth thin film transistor is connected with the pulling-down node.

17. The shift register of claim 15, characterized in that the holding module comprises a fifth thin film transistor and a sixth thin film transistor; a gate of the fifth thin film transistor is connected with the source of the first thin film transistor, the drain of the second thin film transistor and the gate of the third thin film transistor; a source of the fifth thin film transistor is connected with the source of the second thin film transistor, the source of the fourth thin film transistor and the power supply terminal, a drain of the fifth thin film transistor is connected with the drain of the third thin film transistor and the clock terminal; a gate of the sixth thin film transistor is connected with the gate of the fifth thin film transistor, a source of the sixth thin film transistor is connected with the power supply terminal, and a drain of the sixth thin film transistor is connected with the clock terminal.

18. The shift register of claim 17, characterized in that the shift register unit further comprises a seventh thin film transistor, a gate of the seventh thin film transistor is connected with the gate of the first thin film transistor and the signal input terminal; a source of the seventh thin film transistor is connected with the source of the second thin film transistor, the source of the fifth thin film transistor, the source of the sixth thin film transistor, the source of the fourth thin film transistor and the power supply terminal; and a drain of the seventh thin film transistor is connected with the drain of the sixth thin film transistor.

19. The shift register of claim 17, characterized in that the holding module further comprises an eighth thin film transistor and a ninth thin film transistor; wherein the case that the drain of the fifth thin film transistor is connected with the clock terminal comprises: the drain of the fifth thin film transistor is connected with a source of the eighth thin film transistor and a gate of the ninth thin film transistor, a gate and a drain of the eighth thin film transistor are connected with the clock terminal, and a drain of the ninth thin film transistor is connected with the clock terminal;

the case that the drain of the sixth thin film transistor is connected with the clock terminal comprises: the drain of the sixth thin film transistor is connected with a source of the ninth thin film transistor, and the drain of the ninth thin film transistor is connected with the clock terminal.

\* \* \* \* \*